United States Patent
Huang et al.

[11] Patent Number: 6,147,844
[45] Date of Patent: Nov. 14, 2000

[54] QUENCH PROTECTION FOR PERSISTANT SUPERCONDUCTING MAGNETS FOR MAGNETIC RESONANCE IMAGING

[75] Inventors: Xianrui Huang; Phillip William Eckels, both of Florence, S.C.

[73] Assignee: General Electric Company, Milwaukee, Wis.

[21] Appl. No.: 09/223,650

[22] Filed: Dec. 30, 1998

[51] Int. Cl.[7] .................................................. H02H 7/00
[52] U.S. Cl. ............................................ 361/19; 361/141
[58] Field of Search .................................... 361/10, 11, 19, 361/58, 141; 336/DIG. 1; 335/216, 296, 299; 174/125.1; 505/825, 850, 879

[56] References Cited

U.S. PATENT DOCUMENTS

| | | | |
|---|---|---|---|
| 4,689,707 | 8/1987 | Schwall | 361/19 |
| 4,956,740 | 9/1990 | Williams | 361/19 |
| 5,731,939 | 3/1998 | Gross et al. | 361/19 |

*Primary Examiner*—Ronald W. Leja
*Attorney, Agent, or Firm*—Irving M. Freedman; Christian G. Cabou; Phyllis Y. Price

[57] ABSTRACT

A quench protection circuit for the series connected but spatially separated magnet coils of a superconducting magnet utilizes a parallel circuit of multiple heaters and reverse connected diodes shunting portions of the series connected magnets coils with the heaters physically positioned in thermal contact with other coils in the series circuit to thermally transfer a heat quenching action in any coil to all coils, along with a shunting current through the diodes to shunt peak currents upon coil quenching to avoid undesired spot temperature rise and enable controlled quenching of the entire magnet upon quenching of any coil.

16 Claims, 3 Drawing Sheets

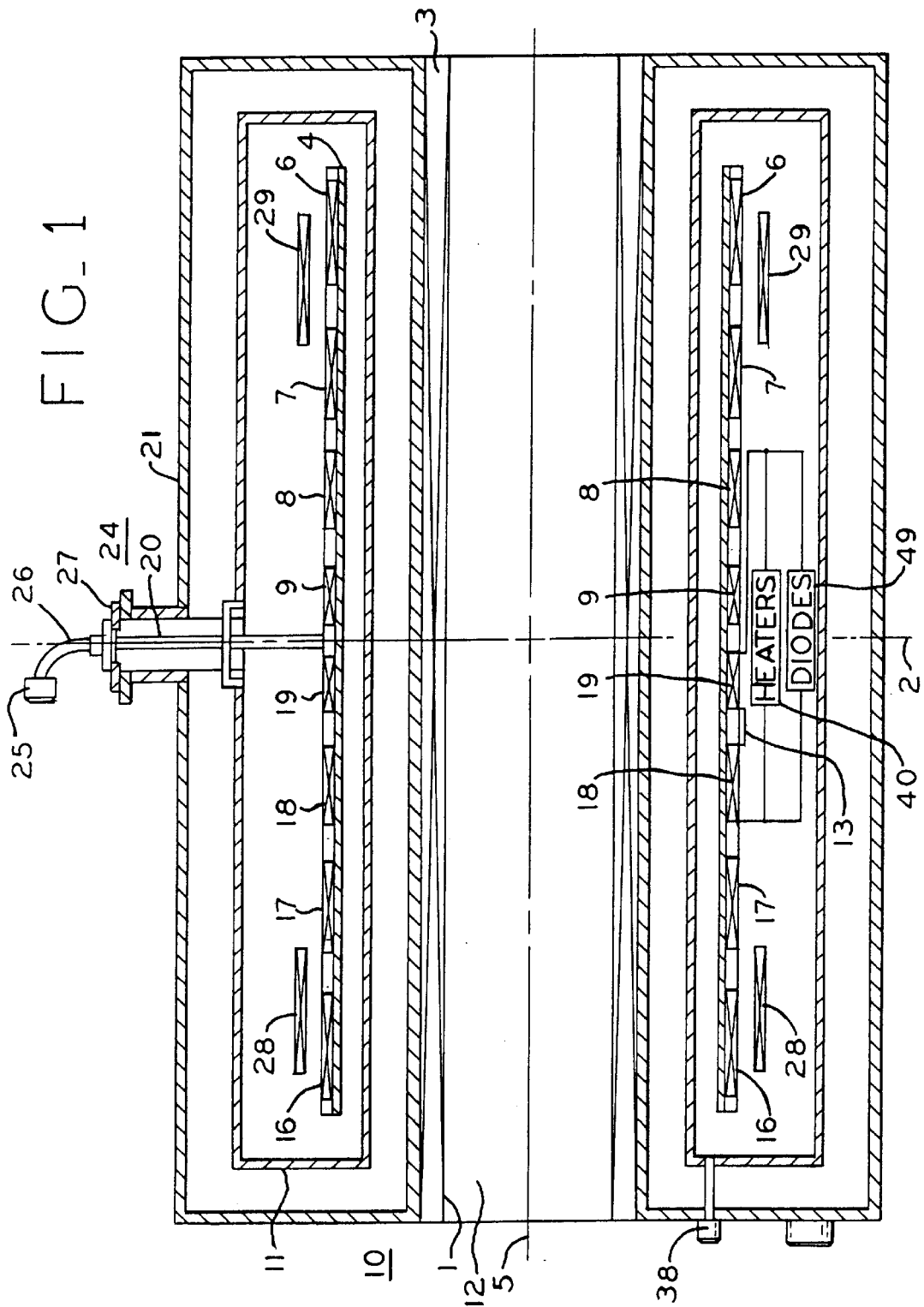

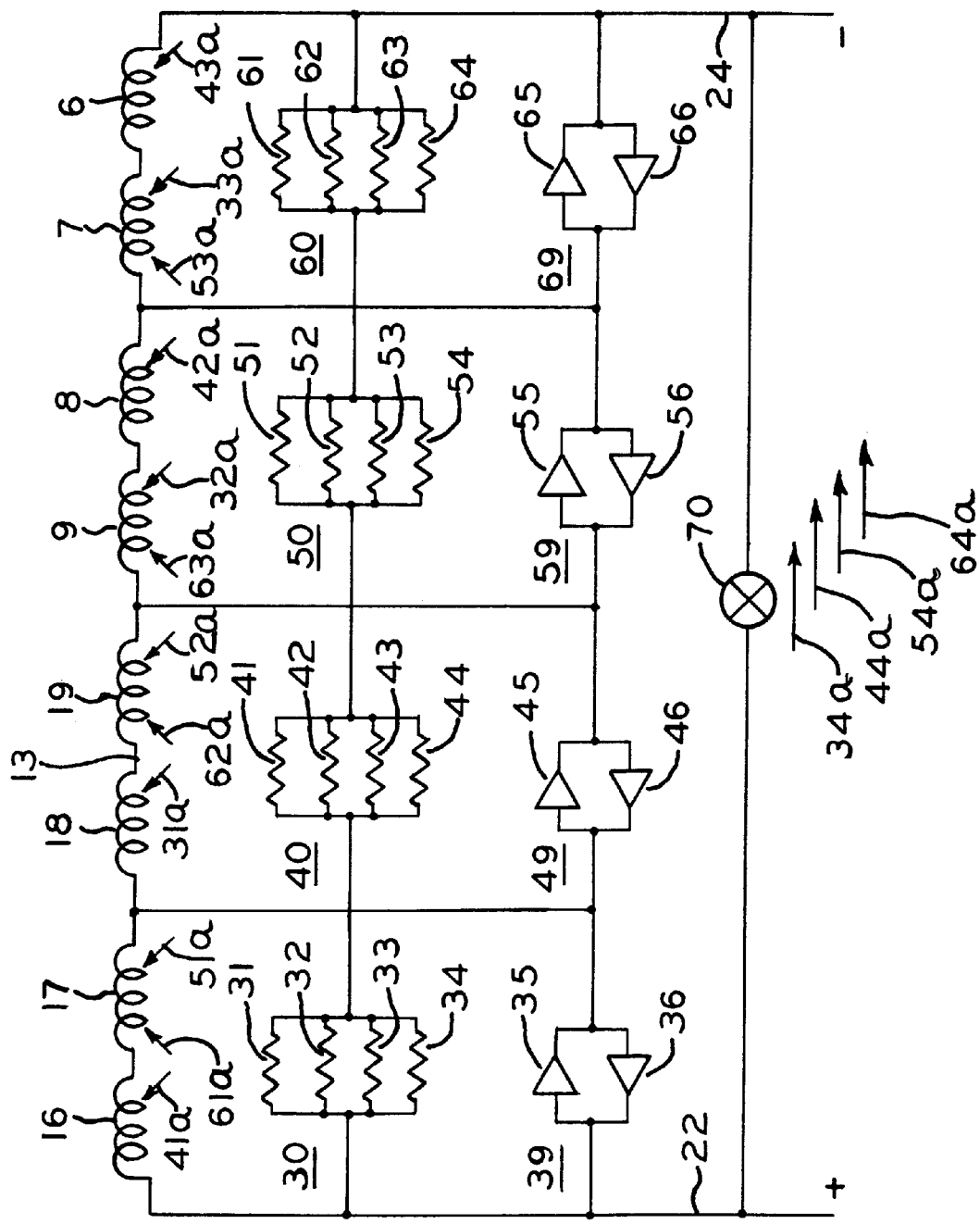
FIG_2

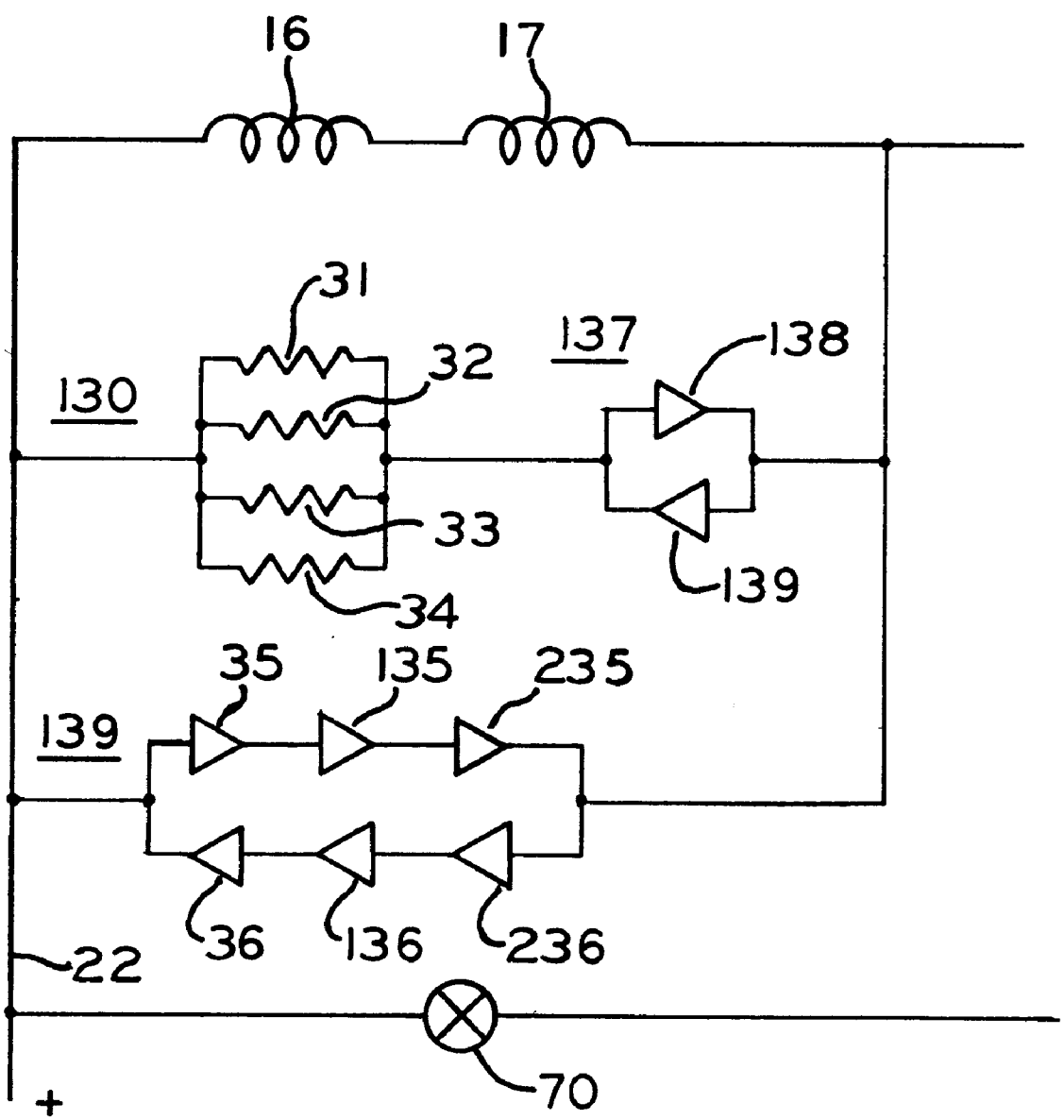
FIG_3

QUENCH PROTECTION FOR PERSISTANT SUPERCONDUCTING MAGNETS FOR MAGNETIC RESONANCE IMAGING

This invention relates to a superconducting magnet assembly for magnetic resonance imaging (hereinafter "MRI"), and more particularly for protection of the magnetic assembly in the event of quenching of superconducting operation.

As is well known, a magnet coil can be made superconducting by placing it in an extremely cold environment, such as by enclosing it in a cryostat or pressure vessel containing liquid helium or other cryogen. The extreme cold enables the superconducting wires to be operated in the superconducting state in which the resistance of the wires is practically zero. In the superconducting state when a power source is initially connected to the coils for a short period of time to introduce a current flow through the coils, the current will continue to flow through the coils, thereby maintaining a strong magnetic field. Superconducting magnets find wide application in the field of MRI.

In a typical MRI magnet, the main superconducting magnet coils are enclosed in a cylindrically shaped cryogen pressure vessel, contained within an evacuated vessel and forming an imaging bore in the center. The main magnet coils develop a strong magnetic field in the imaging volume of the axial bore.

A common cryogen is liquid helium which during superconducting operation boils to form helium gas which is either recondensed for recyling and reuse or is vented to the atmosphere.

A major concern in such apparatus is that of the discontinuance or quenching of superconducting operation which can produce undesirable and possibly damaging voltages within the magnet. Quenching occurs when an energy disturbance, such as from a magnet coil frictional movement, heats a section of superconducting wire, raising its temperature above the critical temperature of superconducting operation. The heated section of wire becomes normal with some electrical resistance. The resulting $I^2R$ Joule heating further raises the temperature of the section of wire increasing the size of the normal section. An irreversible action called quench then occurs in which the electromagnetic energy of the magnet is quickly dumped or converted into thermal energy through the increased Joule heating.

In order to provide the required magnetic field homogeneity in the imaging volume for MRI operation the magnet coil is divided into a plurality of subcoils spaced along and around the axis of the superconducting magnet such that they are not thermally connected. As a result, when only one of the superconducting coils quenches the entire energy of the strong magnetic field may be dumped into the quenching coil causing a hot spot and possible damage unless a suitable quench system provides protection which can be accomplished by quenching the other coils.

Sudden quenching of superconducting operation can cause sharp temperature rises which can burn or damage the superconducting wires. In addition, the rapid decrease in the molecular density within the cryogen vessel resulting form a sharp temperature rise sharply reduces the insulating ability normally provided by the gas resulting in possible voltage breakdown through the gas which can seriously damage the various coils and associated control circuitry of the elements within the cryogen vessel giving rise to the need for means to limit voltage rise across the coils during quench.

Shunting the sub-coils with dump resistors to limit quench current flow can provide quench protection. However, it is expensive to provide the relatively large resistors required to provide a large current carrying capacity. In addition, such dump resistors result in a time constant transient which negatively impacts magnetic field stabiliy and image quality.

SUMMARY OF INVENTION

Thus, there is a particular need for improved quench control and protection in a superconducting magnet which can overcome the aforementioned interrelated problems and minimize the curent flow and temperature rise in all of the subcoils.

In accordance with one form of the invention, portions of the series connected magnet subcoils are each connected in circuit with a quench protection circuit shunted by a plurality resistive heaters in parallel which are in turn shunted by a pair of reverse connected diodes which conduct during quenching to shunt a part of the magnetic coils current flow to avoid destructive spot heating of the magnet coils shunted by the quench protection circuit.

More particularly, individual quench protection circuits are connected across different of the magnet coils and the heaters of each are physically positioned within the associated protected magnet coils. Such a voltage generated by a normal zone of a quenching coil will heat heaters positioned within other subcoils to subsequently quench those other coils. This action provides quench protection by quickly spreading the normal zone to deposit the magnet energy into a large portion of the magnet coil.

A plurality of diodes may be connected in series to enable selection of their voltage breakdown to the desired turn-on voltage. In addition, in order to eliminate undesirable current flow paths through the heaters during superconducting operation diodes may be provided in series with the heaters to stop current flow prior to the turn on voltage being applied to the diodes during quenching.

DESCRIPTION OF DRAWINGS AND INVENTION

FIG. 1 is a cross section of a superconducting MRI magnet including the present invention.

FIG. 2 shows details of the quench protection circuit of FIG. 1.

FIG. 3 shows details of a variation of the quench protection circuit of FIGS. 1 and 2.

Referring first to FIGS. 1 and 2, superconducting magnetic resonance imaging magnet assembly 10 includes cryogen pressure vessel 11 concentrically within donut shaped vacuum vessel 21 forming a central imaging bore 12 or volume about axis 5. Positioned within pressure vessel 11 is composite drum 4 with several pairs of main magnet coils 16, 17 and 18 of decreasing axial length toward plane 2 perpendicular to axis 5. Main magnet coils 16, 17 and 18 are axially spaced on composite drum 4 and wound in axial slots on the drum. Additional coils such as bucking coils 28 and 29 are provided to contribute to reducing the external magnetic field.

External electrical power and control connections are provided through access port 24 by lead assembly 26 which includes connector 25 outside vacuum vessel 21 and conduit 20 passing through plate 27 and cryogen vessel 11 for electrical connection to the components including magnet coils 6, 7, 8, 9, 16, 17, 18, 19, 28 and 29 within cryogen pressure vessel 11. In the case of liquid helium cooled MRI magnet assembly 10, liquid helium is provided through inlet pipe such as 38 to pressure vessel 11.

Positioned in sleeve 1 against the central bore of vacuum vessel 21 surrounding central imaging bore 12 is gradient coil 3 to pulse or fire a series of imaging "snapshot slices" along axis 5 of a patient within imaging bore 12.

During operation of superconducting MRI magnet assembly 10, main magnet coils 16, 17, 18, 19, 9, 8, 7 and 6 and associated coils such as bucking coils 28 and 29 would be rendered superconducting in the usual manner by charging an electrical current through them for a short period of time after reducing the temperature within pressure vessel 11 to the appropriate superconducting temperature for the magterial used, and then discontinuing the electrical current flow from external sources and putting the coils in a persistant mode.

As best shown in FIG. 2, superconducting main magnet coils 16, 17, 18, 19, 9, 8, 7, and 6 are electrically connected in series. Connected across magnet coils 16 and 17; 18 and 19; 9 and 8; and 7 and 6; respectively, and in parallel therewith are shunt quench heater or resistive load circuits 30, 40, 50 and 60 each of which are in turn shunted by reverse connected diodes 35, 36; 45, 46; 55, 56 and 65, 66; respectively. Series connected magnet coils 16 and 17 are shunted by a plurality of heaters 31, 32, 33 and 34 with diodes 35 and 36 connected in parallel in a reverse polarity connection with the emitter of each connected to the collector of the other. In a similar manner series connected magnet coils 18 and 19 shunted by heaters 41, 42, 43 and 44 in parallel also by reverse connected diodes 45 and 46; series connected coils 9 and 8 are shunted by heaters 51, 52 53 and 54 and also by reverse connected diodes 55 and 56; and series connected magnet coils 7 and 6 are shunted by heaters 61, 62, 63 and 64 and also by reverse connected diodes 65 and 66. Individual parallel heaters such as 31, 32 and 33 of heater circuit 30 are each physically positioned within a coil of the remaining coil pairs 18, 19; 9, 8 and 7, 6 as indicated generally by arrows 31*a* 32*a* and 33*a* in FIG. 2. Thus, heater circuits 30, 40, 50 and 60 while being electrically connected in parallel with their associated magnet coils 16, 17; 18, 19; 9, 8; and 7, 6, respectively, and a reverse connected diode pair 39, 49, 59 and 69 have their individual heaters physically separated, positioned within and in thermal contact with each of the remaining coil circuits. This enables each coil circuit upon quenching to provide heating and quenching action to all of the other main magnet coils.

Thus, in the event of quenching of magnet coil 16 the normal zone resistance will generate a voltage across heaters 31, 32, 34 and 33 and result in a rise in heater temperature and the temperature of coils 18, 9 and 7, 6 to cause quenching of the associated coil pairs 18, 19; 9, 8; and 7, 6, respectively. This avoids a localized hot spot in coil 16 if the quenching were localized to coil 16, which would absorb the entire magnetic field energy. Distributing the energy of the entire magnetic field over all of the main magnet coils distributes the energy dissipation and heating and prevents voltage breakdown and possible burning or damage to the wires of superconducting coil 16.

Similarly, a quenching in any of the other magnet coil pair circuits results in heating and controlled quenching in all of the other different main magnet coil pairs through the physical thermal conducting by parallel heater elements positioned within the other 3 magnet coil pairs to provide simultaneous heating of all coil pairs rather than localized heating in order to substantially simultaneously quench all magnet coil pairs. Thus, heaters 41, 42, 44 and 43 which receive current flow on quenching of coils 18, 19 will provide heat to the remaining coil pairs 16, 17; 9, 8; and 7, 6 respectively because of the heaters being positioned within those coils (such as heater 41 within coil 16, heater 42 within coil 8 and heater 43 within coil coil 6). A similar heat distribution upon quenching is provided by positioning heater 51 within coil 17, heater 52 within coil 18 and heater 53 within coil 7; and in the same manner by positioning heater 61 within coil 17; heater 62 within coil 19; and heater 63 within coil 9. Heaters responsive to quenching of the remote magnet coil pairs can be placed within one magnet coil of a coil pair or both with 2 or even all 3 of the heaters positioned within a single coil of a coil pair. That is, they must be positioned to be thermally connected to the remote coil pairs for which they provide heat for quenching.

The physical positioning of various other heaters are similarly indicated by arrows bearing the number of the heater. The positioning of the heaters thus thermally interconnect all of the main magnet coils to transfer a heat induced quenching action within one pair to all of the other pairs distributing the quenching of the magnet field and potential heat within superconducting magnet 10 and preventing localized hot spots and damage.

The resistance of the heaters is chosen such that they will generate enough heat to quench the coils at voltage levels below the threshold voltage of the diodes at liquid helium temperature. When a normal zone starts to grow in one coil, the voltage across the coil increases, heating and then quenching other coils. As the voltage continues to rise and eventually exceed the threshold voltage of the diode circuit that shunts the coil pair, the diodes voltage across the heaters reduces to approximately one volt of diode forward voltage. Thus, the heaters are provided and designed to quench the coils before the diodes become conducting while having as large a resistance as possible. A large resistance during a normal operation reduces the effect of any external electromagnetic disturbance which could induce minimal current flowing through those heater loops which could affect image quality of the MRI system.

The selection and combination of diodes and heater characteristics and specifications are selected to provide the desired sequential operation so that the heaters will turn the magnetic subcoils such as 16 and 17 normal before the associated diodes such as 39 become conducting.

FIG. 3 shows the use of additional diodes to obtain the desired quenching control action. Circuits 30 and 39 of FIG. 2 have been modified to circuits 130 and 139 as described below. Diode circuit 139 includes diodes 135 and 235 in series with diode 35, and diodes 136 and 236 in series with diode 36 with the added diodes maintaining the same reversed polarity circuit. The use of multiple diodes increases the threshold voltage of the diode circuit 139.

Reverse polarity diode circuit 137 includes diodes 138 and 139 connected in series with parallel heater circuit 31, 32, 33, 34 and across magnet coils 16 and 17. These diodes make the heater current loop completely open during normal operation, thus eliminating the above mentioned externally induced current and ensuring better image quality of the MRI system.

Circuits of additional diodes would be similarly provided across coil segments 18, 19; 9, 8; and 7, 6.

It is thus seen that selection of the types and number of diodes and heaters can be used to tailor the quenching action to that which provides the desired control and protection.

Spatially separated magnet coils 6, 7, 9, 16, 17, 18 and 19 are not thermally connected such that the controlled quenching operation provided by quench protection circuits 30, 39; 40, 49; 50, 59; and 60, 69 control the individual quenching of their associated coils 16, 17; 18, 19; 9, 8 and 7, 6; respectively.

While the present invention has been described with respect to certain preferred embodiments thereof, it is to e understood that numerous variations and details of construction, the arrangement and combination of parts, and the type of materials used may e made without departing from the spirit and scope of the invention.

What is claimed is:

1. A superconducting main magnet coil quench protection for a magnetic resonance imager magnet assembly comprising:

a cryogen pressure vessel surrounding a central imaging bore;

a plurality of spatially separated superconducting main magnet coil portions connected in series forming a main coil series circuit in said cryogen vessel and surrounding said imaging bore to provide a magnetic field in said imaging bore;

a liquid cryogen in said cryogen vessel which produces cryogen gas in cooling said coil portions to superconducting temperatures;

a first temperature limiting circuit electrically connected in parallel with each main magnet coil portion to limit the temperature rise of each of said magnet coil portions upon the start of quenching of superconducting operation of any one of said magnet coil portions;

each of said first temperature limiting circuits including a quench heater circuit with a plurality of quench heaters connected in parallel for all of the parallel quench heaters to be simultaneously energized upon quenching action of the main magnet coil portion they are in parallel with; and different of said parallel quench heaters of each temperature limiting circuit positioned in thermal contact with different of said separated main magnet coil portions being protected to raise the temperature of all of said separated main magnet coil portions being protected and to simultaneously begin quenching the superconducting operation of all of such different main magnet coil portions upon the quenching action of said one or more main magnet coil portions through the simultaneous heating of all of said main magnet coil portions upon quenching of any of said main magnet coil portions;

the number of said quench heaters connected across each of said separated main magnet coil portions being at least equal to the number of said main magnet coil portions being protected;

said main coil series circuit distributing the energy and heat within said magnetic field upon said start of quenching of said any one of said main magnet coil portions to avoid the development of a hot spot in said any one of said main magnet coil portions.

2. The superconducting main magnet coil quench protection circuit of claim 1 wherein a first reverse polarity diode circuit is in parallel with each said quench heater circuit.

3. The superconducting main magnet coil quench protection circuit of claim 2 wherein said quench heaters are positioned within the coil portions with which they are in thermal contact.

4. The superconducting main magnet coil quench protection circuit of claim 3 wherein a second reverse polarity diode circuit is connected in series with each said quench heater circuits across said adjacent coil portions.

5. The superconducting main magnet coil quench protection circuitry of claim 4 wherein each said first reverse polarity diode circuit includes a plurality of diodes in series increasing the voltage at which said first diode circuits become conductive.

6. The superconducting main magnet coil quench protection circuit of claim 5 wherein said diodes and said heaters are selected to control the shunting of their associated coil portions with conducting through said heaters commencing prior to conduction through said diodes.

7. The superconducting main magnet coil quench protection circuit of claim 6 wherein conduction current through said heater circuit and through said first and second reverse polarity diode circuits limits the hot spot temperature of their associated magnet coil portions.

8. The superconducting main magnet coil quench protection circuit of claim 6 wherein said diodes and said heaters are selected to provide a magnet quenching control wherein current flow commences in said heater circuit prior to current flow through said second reverse polarity diode circuit.

9. The superconducting main magnet coil quench protection circuit of claim 2 wherein each of said diode circuits are nonconducting during superconducting operation of the coil portions across which they are connected.

10. The superconducting main magnet coil quench protection circuit of claim 9 wherein current flow through said diode circuits is initiated when the breakdown voltage of said diode circuit is reached shunting current flow through said diode circuits.

11. The superconducting main magnet coil quench protection circuit of claim 10 wherein said heater circuits and said diode circuits limit current flow through, and temperature rise of, the coil portions which they shunt in the event of quenching of said coil portions.

12. A superconducting main magnet coil quench protection for a magnetic resonance imager magnet assembly comprising:

a cryogen pressure vessel surrounding a central imaging bore;

a main magnet coil quench protection circuit including:
      a plurality of spatially separated superconducting main magnet coil portions connected in series in said cryogen vessel forming a main magnet series coil circuit and surrounding said imaging bore to provide a magnetic field in said imaging bore;

a plurality of heater circuits each connected across a portion of said main magnet series coil circuit;

each of said heater circuits including a plurality of heaters in parallel;

a heater from said plurality of heaters in each heater circuit positioned in thermal contact with the other coil portions of said main magnet series coil circuit;

the number of said heaters connected in parallel with each of said separated main magnet coil portions being at least equal to the number of said main magnet coil portions being protected;

all of the heaters in one of said heater circuits heating upon current flow there through upon quenching of the coil portion shunted by said one of said heater circuits;

providing simultaneous heating and quenching action of all said main magnet coil portions upon current flow through any heater circuit upon quenching of the coil portion it shunts.

13. The superconducting main magnet coil quench protection circuit of claim 12 wherein a first reverse polarity parallel diode circuit is connected across each of said heater circuits and their associated coil main magnet portion.

14. The superconducting main magnet coil quench protection circuit of claim 13 wherein a second reverse polarity parallel diode circuit is connected in series with each of said heater circuits to control the voltage at which heater current commences.

15. The superconducting main magnet coil quench protection circuit of claim 14 wherein said second reverse polarity parallel diode circuit includes at least two branches in parallel with each said protected coil portion and each of said parallel branches includes a plurality of diodes in series.

16. The superconducting main magnet coil quench protection circuit of claim 15 wherein diodes of each said first reverse polarity parallel diode circuit and the heaters associated therewith are selected to control the different voltages at which current flows through said heaters and subsequently through said second reverse polarity parallel diode circuit.

* * * * *